United States Patent [19]
Jewell et al.

[11] Patent Number: 5,331,654
[45] Date of Patent: Jul. 19, 1994

[54] POLARIZED SURFACE-EMITTING LASER

[75] Inventors: Jack L. Jewell; Greg R. Olbright, both of Boulder, Colo.

[73] Assignee: Photonics Research Incorporated, Longmont, Colo.

[21] Appl. No.: 26,806

[22] Filed: Mar. 5, 1993

[51] Int. Cl.$^5$ .............................................. H01S 3/10
[52] U.S. Cl. ........................................ 372/45; 372/18
[58] Field of Search ................... 372/18, 27, 105, 106, 372/50, 46, 45, 44, 43

[56] References Cited

U.S. PATENT DOCUMENTS

| | | | |
|---|---|---|---|
| 5,115,442 | 5/1992 | Lee et al. | 372/96 |
| 5,255,278 | 10/1993 | Yamanaka | 372/27 |

OTHER PUBLICATIONS

Wipiejewski, T., Panzlaff, K., Zeeb, E., Ebeling, K. J., "Vertical cavity laser diodes with two-sided output and polarization control with external feedback," Univ. of Ulm, Germany (Sep. 1992).

Mukaihara, T., Koyama, F., Iga, K., "Stress Effect for Polarisation Control of Surface Emitting Lasers," *Electronics Letters*, vol. 28, No. 6 (Mar. 12,1992), pp. 555–556.

Jewell, J. L., Harbison, J. P., Scherer, A., Lee, H., Florez, L. T., "Vertical-Cavity Surface-Emitting Lasers: Design, Growth, Fabrication, Characterization," *IEEE Journal of Quantum Electronics*, vol. 27, No. 6 (Jun. 1991), pp. 1332–1346.

Chang-Hasnain, C. J., Harbison, J. P., Hasnain, G., Von Lehmen, A. C., Florez, L. T., Stoffel, N. G., "Dynamic, Polarization, and Transverse Mode Characteristics of Vertical Cavity Surface Emitting Lasers," *IEEE Journal of Quantum Electronics*, vol. 27, No. 6 (Jun. 1991), pp. 1402–1408.

Shimizu, M., Mukaihara, T., Baba, T., Koyama, F., Iga, K., "A Method of Polarization Stabilization in Surface Emitting Lasers," *Japanese Journal of Applied Physics*, vol. 30, No. 6A (Jun. 1991), pp. L 1015–L 1017.

*Primary Examiner*—Rodney B. Bovernick
*Assistant Examiner*—Robert McNutt
*Attorney, Agent, or Firm*—Fisher & Associates

[57] ABSTRACT

A vertical-cavity, surface-emitting semiconductor diode laser having a monolithic and planar surface and having lateral anisotropy in order to control the polarization of the emitted beam of light. The diode laser includes a body of a semiconductor material having an active region therein which is adapted to generate radiation and emit the radiation from a surface of the body, and a separate reflecting mirror at opposite sides of the active region with at least one of the mirrors being partially transparent to the generated light to allow the light generated in the active region to be emitted therethrough. The anisotropy may be provided by utilizing anisotropy in the atomic or molecular structure of the materials forming the laser, or by anisotropic patterning or deliberate offset alignment in processing of the laser or through anisotropic structures in the laser cavity to control the polarization of the emitted beam.

28 Claims, 3 Drawing Sheets

POLARIZED SURFACE-EMITTING LASER

This invention was made with Government support under Contract No. F30602-92-C-0091 awarded by Rome Lab, Department of the Air Force. The Government has certain rights in this invention.

BACKGROUND OF THE INVENTION

1. Field of the Invention

The present invention relates to a semiconductor vertical-cavity, surface-emitting laser, and, more particularly, to a semiconductor vertical-cavity, surface-emitting laser with monolithic and planar structure and having lateral anisotropy in order to control the polarization of the emitted beam of light.

2. Description of the Prior Art

Semiconductor laser diodes, in general, comprise a body of a semiconductor material having adjacent regions of opposite conductivity type forming a p-n junction therebetween. The body is adapted to generate and emit radiation when an appropriate potential is applied across the p-n junction. Vertical-cavity, surface-emitting lasers (VCSELs) emit radiation in a direction perpendicular to the plane of the substrate rather than parallel to the substrate as in the case of conventional edge-emitting diode lasers. In contrast to the elliptical and astigmatic beam quality of conventional edge emitting lasers, VCSELs advantageously emit a circularly symmetric Gaussian beam. Thus, anamorphic correction of the emitted beams of VCSELs is not required. VCSELs moreover, can readily be made into one- and two-dimensional laser arrays as well as be fabricated in extremely small sizes. Accordingly, VCSEL arrays have various applications in the fields of optical memory, laser printing and scanning, optical communications, integrated optoelectronic integrated circuits, optical computing, optical interconnection, etc.

The circular symmetry of the beams emitted from VCSELs arises partly from the fact that they are usually fabricated in a circularly-symmetric structure. It is also well known that VCSELs fabricated in square or even rectangular shaped structures tend to emit circularly-symmetric beams. A consequence of this circular symmetry is the lack of a preferred polarization direction. VCSEL beams emitting in a single transverse mode are linearly polarized. However, the relative direction of the polarization is often different from one VCSEL element to another within an array. For optical systems employing arrays of VCSELs, the variation in polarization direction can greatly degrade system characteristics, such as efficiency and beam uniformity. Because of the high finesse of VCSEL cavities, a slight anisotropy in the optical characteristics can give slight preference to one polarization direction and thus cause the laser to emit a beam polarized in the preferred direction. The semiconductor material forming the VCSELs is crystalline, and the beams show a statistical preference to be polarized in alignment with one or the other major crystal axes, for example in line with the <110> axis or the <010> axis. The ambiguity in polarization direction remains however.

Polarization of VCSEL beams has been controlled by deliberately introducing anisotropies into VCSEL cavities. Anisotropic diffraction losses were introduced by depositing high refractive index material onto opposing sidewalls of an etched VCSEL, thereby stabilizing the polarization as described in an article by Shimazu, et al., entitled "A method of polarization stabilization in surface emitting lasers," published in the JAPANESE JOURNAL OF APPLIED PHYSICS, Vol. 30(6A), June, 1991, pgs. L1015-L1017. This method, as described in the article, requires etching through the top mirror, is not effective when the device is larger than about 5 μm across, and this device utilized a hole etched through the entire semiconductor substrate. Another technique, which uses anisotropic strain through a rectangular etch to control polarization has been described in an article by T. Mukaihara, et al., entitled "Stress effect for polarisation control of surface emitting lasers," published in ELECTRONICS LETTERS, vol. 28(6), Mar. 12, 1992, pgs. 555-556. This technique requires etching a rectangular hole through the entire semiconductor substrate. Alternatively, the authors suggested polarization control by externally applying stress in mounting the device. Both of the devices described above used a hole etched through the substrate, resulting in a nonplanar device. This greatly complicates the fabrication and greatly reduces the heat dissipation capability of the devices. The approach of applying an external stress in the mounting results in a non-monolithic device which is subject to nonuniformity and reliability problems. Yet another approach described by Wipiejewski et al., presented at the European Conference on Optical Communication, September 1992, uses an external cavity containing a polarizer to control the polarization of the emitted beam. All these prior art approaches to polarization control suffer serious drawbacks through being nonplanar or requiring external apparatus, and are not considered practical.

SUMMARY OF THE INVENTION

The present invention relates to a monolithic and planar vertical-cavity surface-emitting laser which comprises a body of a semiconductor material having an active region therein which is adapted to generate radiation and emit the radiation from a surface of the body and is structured to give substantial preference for the laser emission to be polarized in one state. Planar, in this case, refers to the structure having no vertical features deeper than about 10 microns. One form of the invention utilizes anisotropy in the atomic, molecular or electronic structure of the materials comprising the VCSEL cavity to control the polarization of the emitted beam. Another form of the invention creates anisotropic features through anisotropic patterning or deliberate offset alignment of features in processing of the VCSELs to control the polarization of the emitted beam. Still another form of the invention creates anisotropic structures within the VCSELs to control the polarization of the emitted beam.

DETAILED DESCRIPTION OF PREFERRED EMBODIMENTS

Figure 1:
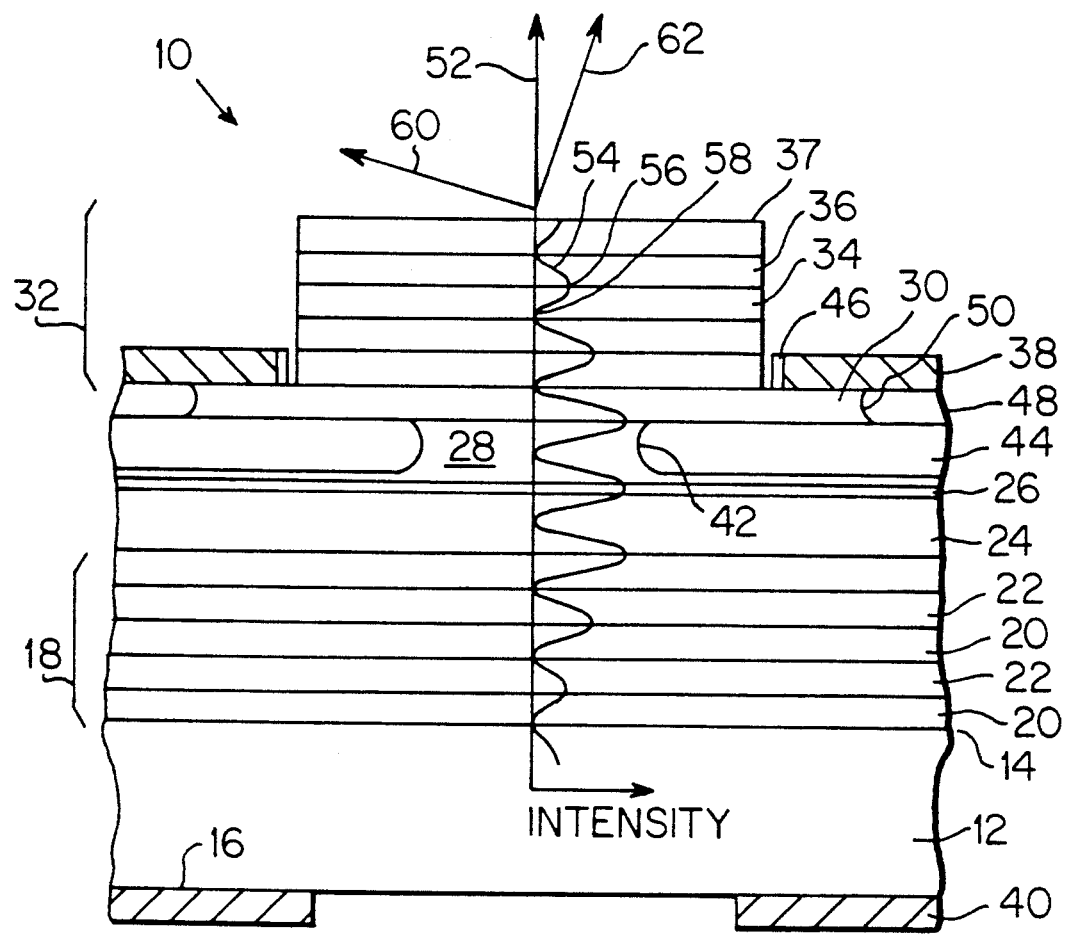
FIG. 1 is a sectional view of a vertical-cavity surface-emitting laser in accordance with the present invention.

Referring initially to FIG. 1, there is shown a sectional view of a vertical-cavity, surface-emitting laser 10 in accordance with the present invention. Laser 10 comprises a substrate 12 of a semiconductor material, such as gallium arsenide, having opposed major surfaces 14 and 16. On surface 14, referred to as the growth surface, the VCSEL structure is placed, starting with first mirror 18. The first mirror 18 is formed of alternating layers 20 and 22 of materials having different indices of refraction. Preferably, the first mirror 18 is a distributed Bragg reflector formed of alternating layers 20 and 22 of high and low index of refraction semiconductor materials which are also electrically conductive. Although first mirror 18 is designed to be reflective, it can also be designed to be partially transparent to light.

On the first mirror 18 is a first clad layer 24 of a semiconductor material of the same conductivity type as the substrate 12. On the first clad layer 24 is a thin active layer 26 containing active material, and on the active layer 26 is a second clad layer 28. The second clad layer 28 is of similar material as the first clad layer 24 but of opposite conductivity type. The active layer 26 may be of a single semiconductor material, nonconductive or of either conductivity type, or may be of a single or multiple quantum well structure or may be of a superlattice structure. The first and second clad layers 24 and 28 are of materials having bandgaps different from that of the active layer 26 so as to confine electrons to the active layer 26. On the second clad layer 28 is a contact layer 30 of a semiconductor material of the same conductivity type as the second clad layer 28.

On the contact layer 30 is a second mirror 32. The second mirror 32 is also formed of alternating layers 34 and 36 of materials having different indices of refraction. Second mirror 32 has a top surface 37. Although the second mirror 32, like the first mirror 18 may be formed of alternating layers 34 and 36 of semiconductor materials, it can also be made of alternating layers 34 and 36 of dielectric materials. In either case, the materials of the alternating layers 34 and 36 have high and low indices of refraction. Second mirror 32 may also be at least partially metallic. Although the second mirror 32 is designed to be reflective, it may also be designed to be partially transparent to light. A contact 38 is on the contact layer 30 at each side of or around the second mirror 32, or on the top surface 37 of the second mirror 32. A contact 40 is on the surface 16 of the substrate 12. As will be explained later in detail, anisotropy is introduced into the optical cavity or the active layer 26 so as to control the polarization of the beam of light emitted by the laser 10.

In the operation of the laser 10, a current is passed through the active layer 26 between the contacts 38 and 40. Current is confined substantially to flow within an active outer boundary 42, by a nonconductive region 44 in the second clad layer 28. The nonconductive region 44 is preferably formed by a deep ion implantation. The contact 38 on the contact layer 30 and around the second mirror 32 forms an optical aperture of the laser 10 having an aperture outer boundary 46. From the contact 38 current is prevented from flowing away from the active layer by a nonconductive region 48 which extends through the contact layer 30. The nonconductive region 48 has an injection outer boundary 50 and is preferably formed by a shallow ion implantation. Alternatively, the nonconductive region 48 can be formed by etching away that portion of the contact layer 30.

The injected current generates light in the active layer 26. The light is reflected back and forth between the first and second mirrors 18 and 32 along cavity axis 52 to achieve lasing of the light. Since at least one of the mirrors, for example the second mirror 32, is also partially transparent, some of the lasing light will pass out of the laser 10 through the mirror 32. The light intensity in the cavity forms a standing wave pattern 54 having peaks 56 and troughs 58 in the intensity. Lasing action occurs when the optical gain per round trip through the active layer exceeds the round trip loss of the optical cavity. By introducing anisotropy into the optical cavity or the active layer, the gain to loss ratio can depend upon the polarization state of the light, and the polarization of the emitted beam can be controlled. For all cases of discussion, the VCSEL cavity is understood to encompass all regions in which light is propagating both toward and away from the active layer 26. At a minimum, the VCSEL cavity includes the region extending from top surface 37 to surface 14. In some cases, the VCSEL cavity may also extend beyond top surface 37 or beyond surface 14, for example to major surface 16. Anisotropies introduced into the VCSEL cavity as described are thus considered to be part of the invention.

Anisotropy in the laser cavity can be introduced into the materials comprising the laser. There are many ways in which material anisotropy in the optical cavity can give preference to one polarization state. If the material is birefringent, i.e., having different refractive indices for light polarized in different orientations, the cavity resonance will occur at different wavelengths for the two polarizations. One of these wavelengths will have greater overall gain in the cavity and will therefore be preferred. Thus one polarization state will be preferred and will dominate the lasing action. Many crystalline dielectric materials such as quartz and calcium fluoride are intrinsically birefringent. Most crystalline semiconductor materials such as gallium arsenide, indium phosphide and the numerous combinations of semiconductors containing gallium, aluminum, indium, arsenic, phosphorus and other elements are not intrinsically birefringent. However, birefringence can be induced in these crystalline semiconductors by a variety of means since they have nonzero piezoelectric coefficients, nonzero electro-optic coefficients, and nonzero nonlinear optical coefficients. The presence of pressure, electric fields or light intensity can thus cause these materials to exhibit anisotropic optical properties such as birefringence and therefore, when present in a VCSEL structure, cause the emitted beam to be polarized. Since the optical intensity is high in VCSELs due to their high reflectivity mirrors, the nonlinear optical coefficient can induce the birefringence. Electric fields caused by application of electrical potential across the VCSEL electrodes, or across separate electrodes, can also induce the birefringence. The strongest birefringence is oriented in a direction related to the magnitudes of the abovementioned coefficients, which are related to the crystal axes. In all these cases, it is therefore important to orient the crystal axes such that the refractive index for light polarized in one first direction perpendicular to optical axis 52 is different than the refractive index for light polarized perpendicular to optical axis 52 and the first direction. Anisotropic gain in the active material can cause the gain to be higher for one polarization state than the other. Examples of such active materials are quantum wires and anisotropic quantum dots; both are typically of semiconductors such as gallium arsenide. Absorption losses can also be anisotropic in a material. A familiar example is the polymer polarizing sheets which, due to having long molecules aligned with one another, absorbs more strongly for one polarization than another. Materials having similar properties can be introduced into the laser cavity to cause anisotropic losses in the cavity, giving preference to one polarization, and therefore controlling the polarization of the laser emission.

Figure 2:
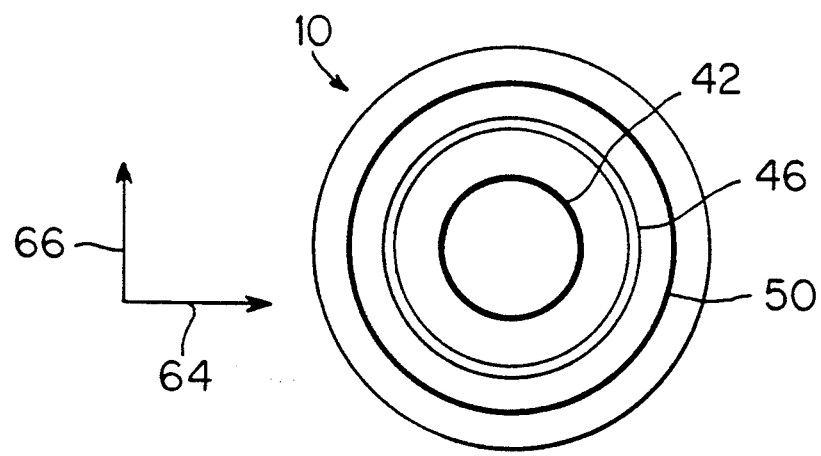
FIG. 2 is a top plan view of FIG. 1.

One means for introducing material anisotropy into the cavity is to orient the semiconductor substrate growth surface 14 at an oblique angle with respect to a major crystal axis, for example the <100> axis, as shown in FIG. 1. Crystal axes 60 and 62 are shown to be oblique to the growth face 14. A consequence of this orientation is illustrated in FIG. 2. FIG. 2 is a top plane view of the laser 10 from the side of the second mirror 32. FIG. 2 shows the outer active boundary 42, the outer aperture boundary 46, and the outer injection boundary 50. Transverse cavity axes 64 and 66 are perpendicular to cavity axis 52. Light which is linearly polarized along transverse cavity axis 64 has its polarization aligned more closely with crystal axis 60 than does light which is linearly polarized along transverse cavity axis 66. Thus the optical properties of the cavity are anisotropic, one polarization state will be preferred over others, and the polarization of the laser emission can be controlled.

Another means for introducing material anisotropy into the cavity is to pattern the semiconductor wafer, with or without semiconductor material grown on top of the substrate, with anisotropic features, followed by epitaxial overgrowth of semiconductor material having a different lattice constant than the underlying material. The different lattice constant results in strain in the overgrown material. The anisotropic patterning makes this strain anisotropic. Therefore the optical properties of the overgrown material will be anisotropic. The anisotropy can manifest itself in the refractive index, absorption, or gain properties of the overgrown material, or combinations thereof. An example of this technique is to grow the structure of semiconductor laser 10 up through first mirror 18. The growth is then stopped and features having, for example, dimensions 7×10 microns, are patterned and etched. The structure up through contact layer 30 is then overgrown. In this example, most of the materials could be aluminum gallium arsenide having various relative concentrations of aluminum and gallium grown on a gallium arsenide substrate. The active material, 26, in this case could be indium gallium arsenide, whose lattice constant does not match to that of aluminum gallium arsenide. Active material 26 would then be anisotropically strained, giving rise to anisotropic refractive index, absorption and gain, thereby causing the semiconductor laser 10 to emit light polarized in one direction.

A related means for introducing material anisotropy into the cavity is to create anisotropic stress by overgrowth of material surrounding the central portion of laser 10. For example the structure of laser 10 could be grown up through contact layer 38. The structure surrounding the central portion of laser 10 could then be etched down into the first mirror 18, followed by overgrowth of material over the region which was etched. If the shape of the etched structure is anisotropic, then strain is exerted on the material of laser 10 which is anisotropic. The resulting anisotropy thereby causes laser 10 to emit light polarized in one direction.

Still another means for introducing material anisotropy into the cavity is to create anisotropic stress, and therefore temporary anisotropic strain, in the substrate during deposition of any of the layers of semiconductor laser 10. When the stress is removed the substrate will return to its original flat shape, thereby causing anisotropic strain in materials which were deposited onto the structure when the substrate was in the stressed state. Such materials will therefore be anisotropically strained and will cause the polarization of semiconductor laser 10 to be polarized in one direction as described above. An example of this process is to fasten the partially fabricated semiconductor laser to a mount having a slightly cylindrical shape, and forcing the substrate to have a slightly cylindrical shape. After depositing upper mirror 32, the structure is loosened from the mount so that it relaxes to its original flat shape. This returning to the flat shape introduces compressive strain in upper mirror 32 only along the direction that had been curved during deposition. The layers 36 and 37 in upper mirror 32 will therefore be anisotropic and cause the emission of semiconductor laser 10 to be polarized as described above.

In all the examples described above the emitted light polarization is usually linear. For the cases of anisotropic gain or absorption, the linear polarization is oriented such that the gain to loss ratio is maximized. For anisotropy in refractive index, the linear polarization direction is generally along, or perpendicular to one of the crystal axes such as the <110>, the preferred axis having a cavity resonance which maximizes the gain to loss ratio as described earlier.

Figure 3:
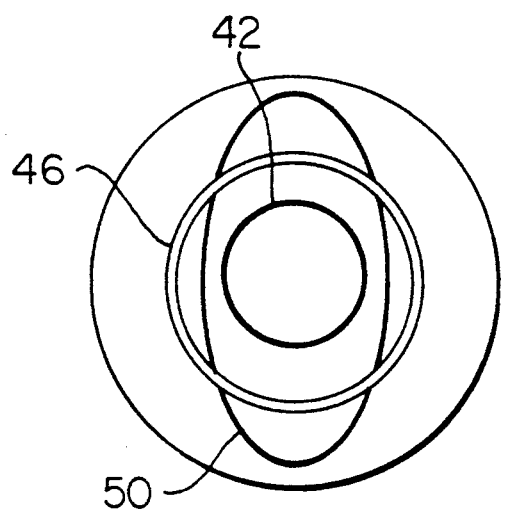
FIGS. 3-6 are views similar to FIG. 2 but showing different means for introducing anisotropy, such as anisotropic current flow or anisotropic loss.
Figure 4:
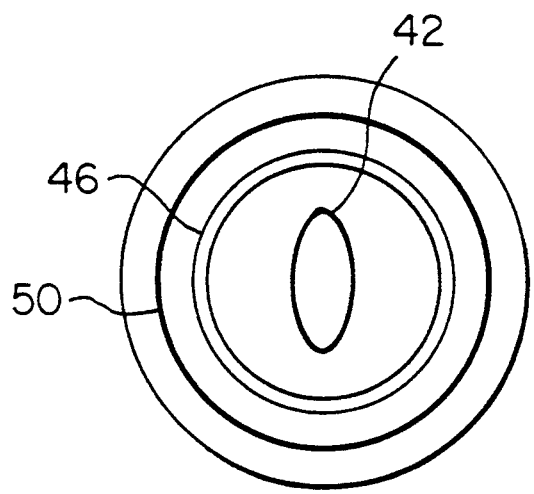
Figure 5:
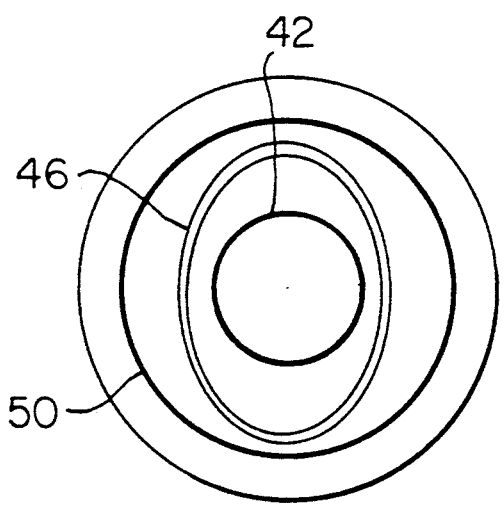
Figure 6:
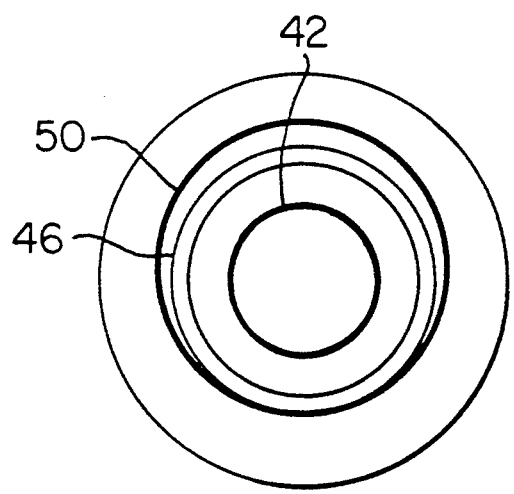

Anisotropic current flow and anisotropic loss can be introduced by anisotropic fabrication of the VCSEL to control its polarization. FIGS. 3–6 show several anisotropic configurations, each of which can be easily accomplished by appropriate patterning of the photolithographic masks used in the fabrication of the laser 10. In FIG. 3, injection outer boundary 50 has been made elongated. In FIG. 4, active outer boundary 42 has been made elongated. In FIG. 5, aperture outer boundary 46 has been made elongated. In FIG. 6, injection outer boundary 50 is not centered with respect to the active outer boundary 42 or the aperture outer boundary 46. All the configurations of FIGS. 3–6 result in anisotropic current flow. There are several consequences of anisotropic current flow. Heating of the device due to electrical resistance will produce an anisotropic, for example cylindrical, thermal lensing effect in the cavity. The electrical fields in the cavity produced by the voltage applied to the contacts can change the optical properties of the materials, making them anisotropic in their optical properties. Anisotropic losses in the cavity, caused by anisotropy in the active outer boundary 42, as shown in FIG. 4, or by anisotropy in the aperture outer boundary 46, as shown in FIG. 5, can also cause the emission of the semiconductor laser 10 to be polarized.

Figure 7:
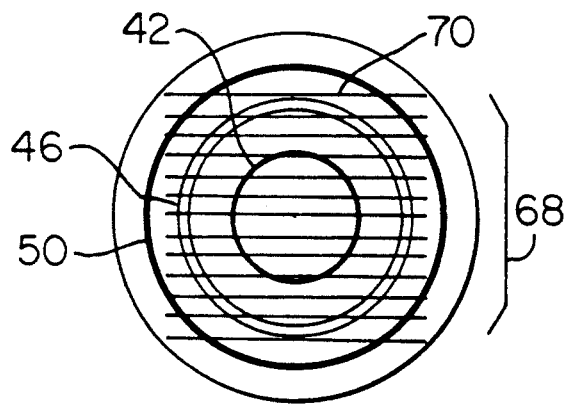
FIGS. 7 and 8 are views similar to FIG. 2 but showing two more different means for introducing anisotropy, such as anisotropic loss or birefringence.

Referring now to FIG. 7, there is shown another approach for introducing anisotropy into a VCSEL, even if all materials used are isotropic and the VCSEL outer boundaries are isotropic. In addition to the outer boundaries previously defined, there is shown an additional anisotropic structure 68 which causes anisotropic losses or birefringence in the optical cavity. Losses are increased for one polarization direction compared to the other by means including, but not limited to, increased absorption, increased scattering, increased diffraction and decreased reflection. Anisotropic structure 68 can also be fabricated to display birefringence. The structure 68 can comprise a material which is isotropic on an atomic scale, but which has been patterned anisotropically. For example, structure 68 can be a grating having grating lines 70. The grating can be in the surface of one of the semiconductor layers of the laser 10, one of the layers (either semiconductor or dielectric) of either of the mirrors 18 or 32, or a separate metal layer, for example gold or tungsten, formed in or on the laser 10. For example, anisotropic structure 68 could be formed by etching into a semiconductor layer of the structure and having on top of it another semiconductor or a dielectric. If etching is the method of forming anisotropic structure 68, the overlying material is also likely to be anisotropic. When anisotropic structure 68 is etched into the top surface 37 of the semiconductor laser 10, the overlying material is most likely air, or it could be a liquid, or it could be a solid material, such as an epoxy. Light polarized linearly along the grating lines will be absorbed more strongly than light polarized perpendicular to the lines 70. The grating shown in FIG. 7 would therefore emit light polarized linearly in the vertical direction. The grating is most effective when the widths of the lines 70 are small compared to an optical wavelength and the lengths are substantially longer than the widths. For emission at visible or near infra-red wavelengths, which are most desirable, the grating line widths are most effective if they are extremely small, thereby making fabrication somewhat difficult to achieve. A consequence of larger widths is increased absorption loss for polarization in the low-loss direction. The effect of anisotropic structure 68 can be controlled by appropriate longitudinal placement in the optical cavity. Referring again to FIG. 1, particularly to the intensity distribution 54, it is seen that the effect of the grating can be maximized or minimized by placing it in the peaks 56 or troughs 58 of the intensity distribution 54, respectively. Furthermore, placing anisotropic structure 68 farther from the active region 26 will incur smaller effects than placing it closer to active region 26. Thus a very lossy grating is most advantageously located in an intensity trough 58 as far as possible from the active region 26.

Another way to control the effect of anisotropic structure 68 is by dilution. Again using the example of a grating, the spacing to width ratio of the grating lines 70 can be increased to decrease the grating's effect. Furthermore, the lengths of the grating lines 70 can be reduced so as not to extend across the entire optical cavity as it does in FIG. 7. Yet another means for controlling the effect of anisotropic structure 68 is to vary the depth of its features along the dimension of cavity axis 52.

Figure 8:
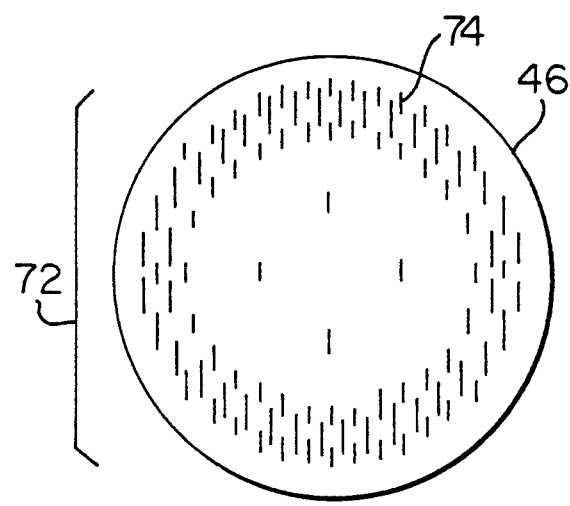

Referring to FIG. 8, there is shown a highly developed anisotropic structure 72 which, for illustrative purposes, uses a grating structure. Here the grating lines 74 are short compared to the aperture outer boundary 46. In FIG. 8 the other outer boundaries referred to previously are not shown in order to better illustrate the distribution of anisotropic structure 72. It is seen that the effect of anisotropic structure 72 can be made as large or as small as desired by varying the density of distribution of the grating lines 74. The distribution of grating lines 74 in FIG. 8 is advantageously chosen to produce smaller losses in the center of the optical cavity where light intensity for the lowest order transverse mode is highest. Thus this kind of grating structure not only gives preference to one polarization, but it can also give preference for one or another transverse mode.

The ability to vary the effect of anisotropic structures 68 and 72 through several means allows the structure to be optimized for manufacturability or for other desirable features. One particular example is to place the anisotropic structure 68 or 72 on the top surface 37 of mirror 32. This location allows the VCSEL to be fabricated through its entire process by normal means, and only then introducing the anisotropy. One desirable configuration is for anisotropic structure 68 or 72 to comprise narrow "trenches" etched into top surface 37. The "trenches" would cause greater loss to occur for one polarization than for the other and thereby control the polarization of the emitted beam. On the other hand, if anisotropic structure 68 or 72 is easily destroyed by environmental factors, as in a metallic grating, it may be preferable to locate it only near top surface 37, allowing the overlying material to protect it.

Figure 9:
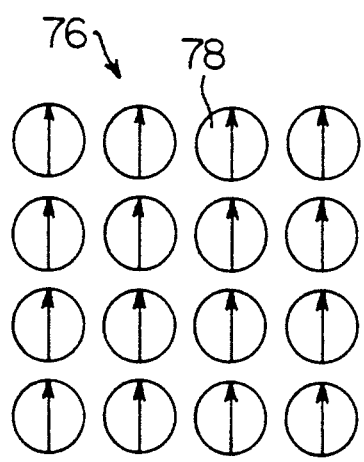
FIG. 9 is a schematic view of an array of VCSELs all having the same polarization.
Figure 10:
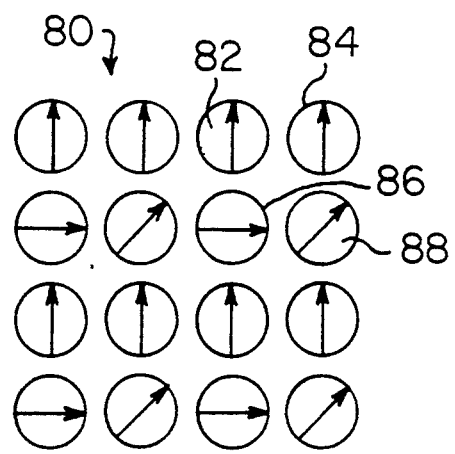
FIG. 10 is a schematic view of an array of VCSELs having different polarizations.

The need for polarization control is greatest when multiple lasers are used in an array. In most cases the desire is for all polarizations to be the same. FIG. 9 illustrates this case for laser array 76, in which all lasers 78, have linear polarization oriented vertically, as indicated by the arrows. In this case all beams will propagate through an optical system (not shown) with nominally identical transmission/reflection characteristics. Such systems are usually appropriate for applications such as optical memory or laser printing. In other applications, such as optical interconnections between electronic chips or boards, it may be desirable to have the polarizations vary over the array. This variation can take numerous forms. One example is shown in FIG. 10 for laser array 80, where each 2×2 subarray has two lasers, 82 and 84, polarized vertically, one laser, 86, polarized horizontally, and one laser, 88, polarized at 45 degrees as indicated by the arrows. In this example the vertically polarized beams will be transmitted to one destination, the horizontally polarized beams to another destination, and the 45 degree beams split to be transmitted to both destinations.

It is to be appreciated and understood that the specific embodiments of the invention are merely illustrative of the general principles of the invention. Various modifications may be made upon the preferred embodiments described consistent with the principles set forth. For example, the laser structure and electrical injection schemes can both take on a variety of forms, differing substantially from the structure illustrated in FIG. 1 and still utilize the invention. Both electrical contacts can be on the top side of the substrate or the upper contact can be on top of the upper mirror. The upper contact can also contribute to the reflectivity of the upper mirror. In this case the aperture outer boundary, as defined, could be zero, and the aperture outer boundary would need re-definition. There is no restriction for the relative sizes of the active, aperture, and injection outer boundaries to be as illustrated in FIGS. 2-7, for example the aperture outer boundary could be smaller than the active outer boundary. The invention is also applicable to optically-pumped VCSELs. Etching processes could replace part or all of the implantations shown. Lifting off of the VCSEL structure from the original substrate does not affect the invention even for cases where substrate orientation is employed because that substrate crystal orientation is preserved in the crystal orientation of the VCSEL structure. Any of the techniques for controlling polarization can be combined. The scope of this invention is indicated by the appended claims rather than by the foregoing description.

What is claimed is:

1. A monolithic vertical-cavity surface emitting laser comprising:
    a body of a semiconductor material having opposed surfaces and an active region therein which is adapted to generate light and emit the light from one of the surfaces thereof;
    a separate reflecting mirror at opposite sides of the active region forming an optical cavity which includes said active region and reflecting mirrors, at least one of the mirrors being partially transparent to the generated light to allow the light generated in the active region to be emitted therethrough; and
    characterized in that the laser is substantially planar by having all vertical projections or holes less than 10 microns deep, and that the laser is structured to give substantial preference for laser emission to be polarized in one predetermined state.

2. The laser of claim 1, further comprising at least one anisotropic material within said cavity oriented to give substantial preference for laser emission to be polarized in one state.

3. The laser of claim 2 in which the anisotropic material is a semiconductor.

4. The laser of claim 3, further comprising a substrate having a growth surface, in which the anisotropy in the semiconductor material results from the substrate growth surface being oriented at an oblique angle with respect to any of the major crystal axes of the substrate material.

5. The laser of claim 3 in which the active region has anisotropic gain.

6. The laser of claim 1 in which the optical losses in the cavity are anisotropic.

7. The laser of claim 1 in which the optical thickness of the cavity is anisotropic.

8. The laser of claim 1 in which at least a portion of the laser is patterned, thereby producing anisotropy in at least one material in the laser.

9. The laser of claim 1 in which the partially formed laser is anisotropically strained during deposition of at least part of the laser.

10. The laser of claim 1 in which the polarization state is linear.

11. The laser of claim 1, wherein said active region is bounded by an active outer boundary, and further comprising:
    means for injecting electrical current from an electrical contact from a region having an injection outer boundary into the active region;
    an optical aperture having an aperture outer boundary;
    characterized in that the boundaries are structured to give substantial preference for laser emission to be polarized in one state.

12. The laser of claim 11 in which the injection outer boundary is anisotropic.

13. The laser of claim 11 in which the active outer boundary is anisotropic.

14. The laser of claim 11 in which the aperture outer boundary is anisotropic.

15. The laser of claim 11 in which the at least one of the boundaries is substantially not centered with respect to at least one other boundary.

16. The laser of claim 1 wherein the optical cavity has a cavity axis and at least one transverse optical mode, and further comprising at least one anisotropically structured material to give substantial preference for laser emission to be polarized in one orientation.

17. The laser of claim 16 in which the anisotropically structured material has first and second dimensions, both dimensions oriented substantially perpendicular to the cavity axis.

18. The laser of claim 17 in which the first dimension is smaller than an optical wavelength.

19. The laser of claim 17 in which the second dimension is larger than an optical wavelength.

20. The laser of claim 17 in which the light in the cavity forms a standing wave intensity pattern having peaks and troughs.

21. The laser of claim 20 in which the anisotropically structured material is placed in the vicinity of a trough of the standing wave intensity pattern.

22. The laser of claim 20 in which the anisotropically structured material is placed in the vicinity of a peak of the standing wave intensity pattern.

23. The laser of claim 16 in which the anisotropically structured material is a metal, a dielectric, a semiconductor, a liquid, a gas, or any combination thereof.

24. The laser of claim 16 in which the anisotropically structured material is furthermore patterned to give preference to one transverse mode of the cavity.

25. The laser of claim 24 in which the transverse mode is the lowest order transverse mode.

26. The laser of claim 1, further comprising an array of lasers in which at least two lasers are structured to give substantial preference for their emitted beams to be polarized in predetermined polarization states.

27. The laser of claim 26, wherein at least two lasers in the array emit beams in the same predetermined polarization state.

28. The laser of claim 26, wherein at least two lasers in the array emit beams in different predetermined polarization states.

* * * * *